United States Patent [19]

Calma et al.

[11] Patent Number: 4,904,935
[45] Date of Patent: Feb. 27, 1990

[54] ELECTRICAL CIRCUIT BOARD TEXT FIXTURE HAVING MOVABLE PLATENS

[75] Inventors: John A. Calma, Selden; Thomas M. Joy, Medford, both of N.Y.

[73] Assignee: Eaton Corporation, Cleveland, Ohio

[21] Appl. No.: 270,866

[22] Filed: Nov. 14, 1988

[51] Int. Cl.⁴ .................. G01R 31/28; G01R 15/12
[52] U.S. Cl. ............................ 324/159 F; 324/158 P; 324/73.1; 324/559
[58] Field of Search ............ 324/158 F, 158 P, 73 PC, 324/72.5; 439/42, 482

[56] References Cited

U.S. PATENT DOCUMENTS

| | | | |
|---|---|---|---|
| 3,584,300 | 6/1968 | Schulz et al. | 324/158 F |
| 4,115,735 | 9/1978 | Stanford | 324/158 F |
| 4,322,682 | 3/1982 | Schadwill | 324/158 F |
| 4,344,033 | 8/1982 | Stowers et al. | 324/158 F |
| 4,357,062 | 11/1982 | Everett | 324/158 F |
| 4,397,519 | 8/1983 | Cooney | 324/158 P |
| 4,496,903 | 1/1985 | Paulinski | 324/158 F |
| 4,528,500 | 7/1985 | Lightbody et al. | 324/158 F |
| 4,536,051 | 8/1985 | Smith et al. | 324/158 F |
| 4,544,886 | 10/1985 | Murray et al. | 324/158 F |
| 4,625,164 | 11/1986 | Golder et al. | 324/158 F |
| 4,633,176 | 12/1986 | Reimer | 324/158 F |
| 4,659,987 | 4/1987 | Coe et al. | 324/158 P |
| 4,667,155 | 5/1987 | Coiner et al. | 324/73 PC |

Primary Examiner—Reinhard J. Eisenzopf
Assistant Examiner—Vinh P. Nguyen
Attorney, Agent, or Firm—A. E. Chrow

[57] ABSTRACT

A test fixture is provided for contacting selected terminals (10, 10') of an electrical assembly for testing by a test device (28). The fixture includes spaced-apart upper platen (2), middle platen (4), and lower platen (6) that are selectively movable according to a selected one of: (a) platen (6) being secured against movement relative platens (2) and (4) and platens (2) and (4) being concurrently and/or independently movable towards and away from platen (6) and; (b) platens (2) and (4) are being secured against movement relative platen (6) and platen (6) being movable towards and away therefrom and; (c) platen (4) being secured against movement relative platens (2) and (6) and platens (2) and (6) being concurrently and/or independently movable relative platen (4). The assembly to be tested is mounted on platen (2) and slected electrical contacts (24, 24') extending towards platen (4) are respectively mounted on platen (6). Contacts (24, 24') are in substantial respective alignment with terminals (10, 10') and are electrically connected to test device (28). An array of openings (14) extend through platen (4) of which selected ones are substantially respectively aligned with terminals (10, 10') and contacts (24, 24'). Each of the selected openings (14) includes an electrically conductive probe member (30) reciprocally movable in opposite axial directions through opening (14) such that movement of the platens according to the selected one of movements (a), (b) and (c) provides electrical contact between terminals (10, 10') and the test device.

5 Claims, 2 Drawing Sheets

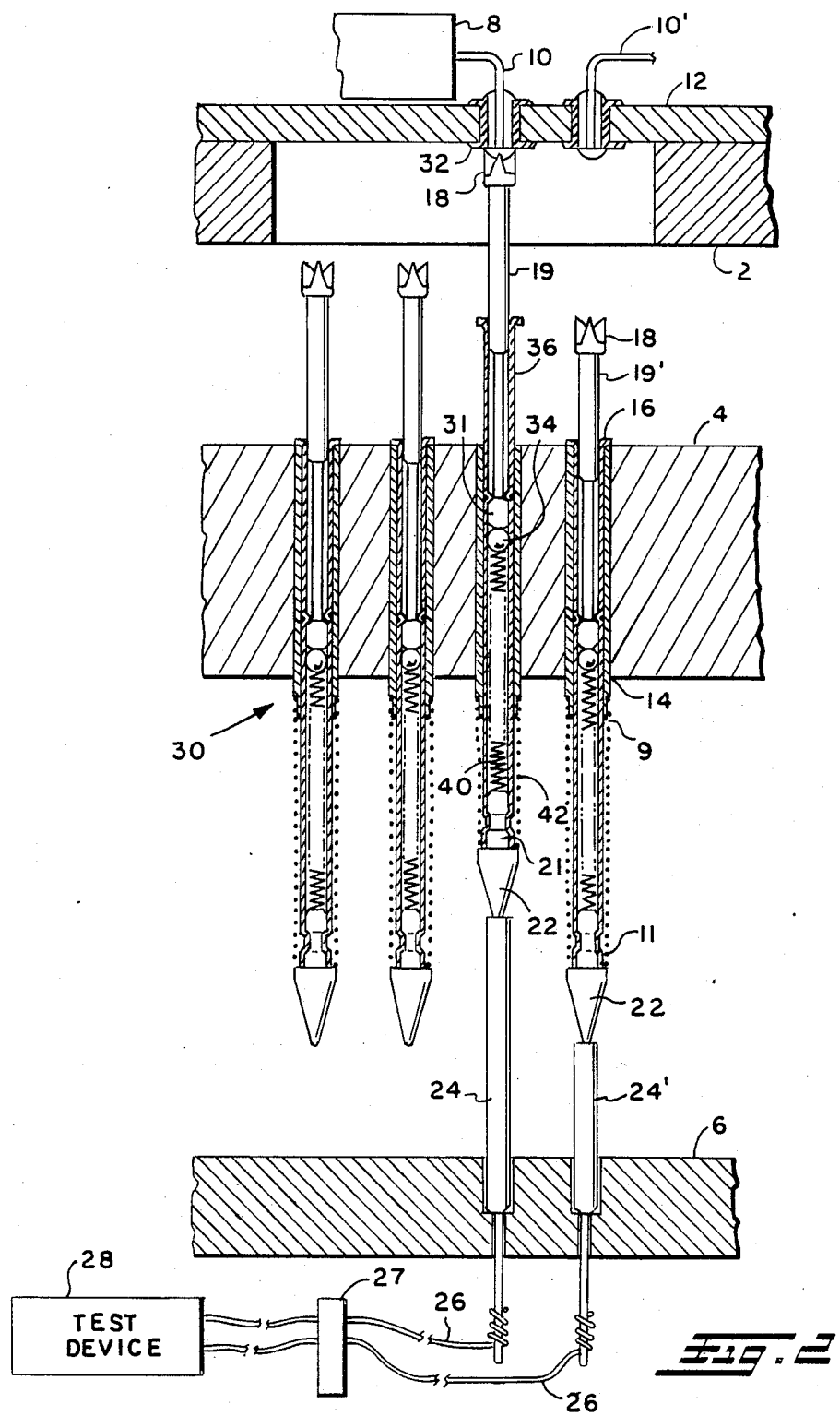

ELECTRICAL CIRCUIT BOARD TEXT FIXTURE HAVING MOVABLE PLATENS

This invention relates generally to a test fixture for testing selected components and/or input versus output functions of an electrical assembly or circuit board and particularly to a universal test fixture that is readily adaptable to test selected components and/or input versus output functions of the same and a variety of different assemblies in a rapid and efficient manner.

BACKGROUND OF THE INVENTION

A variety of methods have heretofore been employed for facilitating testing of selected components and/or input versus output functions of electrical assemblies in a rapid and effective manner. Such methods are commonly employed for quality control, trouble shooting, and for analysis purposes and ordinarily must be done rapidly in order to minimize costs and expenses.

The assemblies commonly include resistors, capacitors and other electrical components of which all or certain selected components must be tested individually and/or in predetermined combinations due to the fact that the components of different assemblies are often arranged differently as well as testing variations of input versus output functions of the entire assembly.

A variety of test fixtures have been developed over past years for testing electrical assemblies. The text fixtures have generally been designed to either test a single assembly or circuit board repetitively or different assemblies according to electrical circuit designs unique to each.

In most cases, the prior-art test fixtures have characteristically featured at least two spaced-apart platens with the assembly mounted on one and a plurality of openings through the other in which electrically conductive probe members are disposed in selected openings corresponding and in registration with the terminal(s) of the assembly or circuit board scheduled to be tested. The probe members are characteristically reciprocally movable relative the openings and at least one of the platens is reciprocally movable towards and away from the other (commonly by application of a vacuum) so as to enable an end of the probe member facing the terminal(s) to make electrical contact therewith. The opposite end of the probe members have characteristically been individually wired directly by electrical conductors to the test device or to an electrical plug which is connected to the test device. Such practice greatly diminishes the universality of the device since the wires must be disconnected in order to arrange a different array of probe members for testing different assemblies or even in some cases for testing different terminals on the same assembly which is costly and time consuming.

Examples of test fixtures that feature such electrical conductor wiring between the probe members and the test device are respectively disclosed in U.S. Pat. Nos. 3,584,300; 4,115,735; 4,344,033; 4,496,903; 4,536,051; 4,544,886; and 4,625,164, the disclosures of which are incorporated herein by reference.

An example of a universal testffixture for which the probe members are not wired directly to the test device is disclosed in U.S. Pat. No. 4,443,756, the disclosure of which is incorporated herein by reference. The test fixture features upper, intermediate, and lower platens with the lower platen provided with a matrix of electrically conductive pads that can be connected in various patterns to the test device according to the terminals of the assembly or circuit board scheduled for testing. The assembly or circuit board to be tested is mounted on the upper platen and probe members are mounted for reciprocal movement through openings through the intermediate platen that are preselected for registration with both particular pads on the bottom platen and terminals scheduled for testing on the assembly mounted in the upper platen. In operation however, the intermediate platen is secured either by vacuum or other means to the lower platen and only the upper platen is reciprocally movable towards and away from the intermediate platen which eliminates a degree of freedom in movement of the lower platen relative the upper platen and consequently diminishes the universality of the test fixture.

Differing types of probe members have been developed over the years for use in test fixtures such as previously described of which but a few examples are disclosed in U.S. Pat. Nos. 4,397,519; 4,633,176; and 4,659,987, the disclosures of which are incorporated herein by reference.

Yet another example of a universal circuit board test fixture is disclosed in U.S. Pat. No. 4,357,062, the disclosure of which is incorporated herein by reference. Although the probe members in this test fixture are not wired to the test device, intermediate rigid pins are employed between the probe members and the terminals to be contacted which greatly increases the complexity of set-up and the time and expense associated therewith.

In contrast to such practice, the present invention provides a universal test fixture that can easily be adapted to test selected components of the same and a variety of different assemblies as well as for analyzing input versus output functions thereof by including an array of probe members that can be selectively employed according to the particular test requirements involved in a simple and economical manner.

SUMMARY OF THE INVENTION

Accordingly, it is an object of this invention to provide a universal test fixture for testing selected components and/or input versus output functions of an electrical assembly.

It is another object of this invention to provide a universal test fixture capable of testing selected components and/or input versus output functions of different electrical assemblies in a rapid and economical manner.

It is still another object of this invention to provide a universal test fixture that can be readily adapted to test selected components and/or input versus output functions of the same and different electrical test assemblies in a rapid and economical manner.

BRIEF DESCRIPTION OF THE DRAWINGS

FIG. 2 is a partial cross-sectional view of another embodiment of the test fixture of the invention.

DESCRIPTION OF SOME PREFERRED EMBODIMENTS

Figure 1:
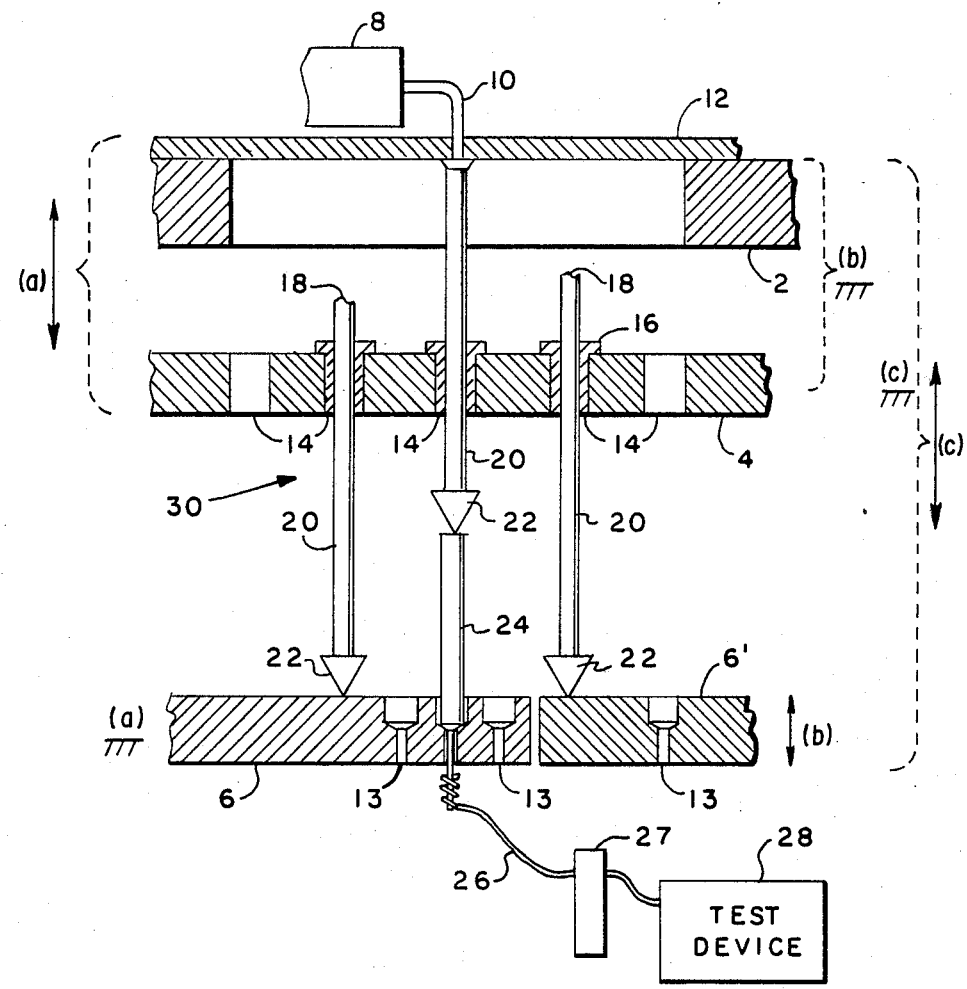
FIG. 1 is a partial cross-sectional view of one embodiment of the test fixture of the invention.

In FIG. 1, the fixture of the invention is being used to enable a test device 28 to receive and provide desired information relative electrical component 8 mounted on a base 12 commonly made from an electrically insulative material and which are commonly called "breadboards" in the trade. Component 8 has a terminal 10 which must be electrically connected to device 28 in order to conduct the particular test desired. Although only one component is shown in FIG. 1, the fixture of the invention is operable to enable selective testing of a plurality of components and/or input versus output functions of the electrical assembly or circuit board being tested.

The fixture of the invention includes an upper platen 2, a middle platen 4 and a lower platen 6 that are in spaced-apart relationship to each other. Platen 6 may comprise two or more separate parts 6, 6' as hereinafter described.

The electrical assembly or circuit board to be tested is secured to upper platen 2 such that terminal 10 extends towards middle platen 4.

Although not shown in the FIGURES, platens 2, 4 and 6 are held in alignment by suitable means such as vertical pins or shafts and are operable to be selectively moved either by: (a) lower platen 6 being restricted against movement relative upper platen 2 and middle platen 4 and upper platen 2 and middle platen 4 being concurrently and/or independently movable towards and away from lower platen 6 or; (b) upper platen 2 and middle platen 4 being concurrently restricted against movement relative lower platen 6 and platen 6 being movable towards and away from upper platen 2 and middle platen 4, or; (c) middle platen 4 is being restricted against movement relative upper platen 2 and lower platen 6 and upper platen 2 and lower platen 6 being concurrently and/or independently movable towards and away from middle platen 4.

Middle platen 4 is provided with an array of openings 14 therethrough such that certain of openings 14 can be preselected to enable the fixture to test selected components of one or a preselected variety of different electrical assemblies.

The fixture of the invention includes an electrically conductive probe member (generally referenced by numeral 30) disposed in at least those opening(s) 14 Preselected for testing a particular component or combination of components.

Likewise, lower platen 6 includes preselected electrical contact(s) 24 extending therefrom towards middle platen 4 for each assembly terminal to be contacted. Contact(s) 24 are preferably selectively disposed in an array of openings 13 through platen 6. Each contact 24 is in substantial registration with the particular assembly terminal to be electrically connected thereto and the particular opening 14 therebetween is in substantial alignment with both the terminal and contact. Platen 6 is preferably made from an electrical insulating material but may also be made of metal in instances where an electrical insulator is disposed about contacts 24 at locations where they contact lower platen 6. Each contact 24 is connected by suitable electrical conducting means such as wiring 26 to device 28 either directly or by the use of suitable electrical plugs and the like such as referenced by numeral 27.

In FIG. 1, probe members 30 each have an electrically conductive first end 18 facing towards upper platen 2 and an opposite electrically conducting end 22 facing towards and adapted to make electrical contact with the contact 24 in alignment therewith.

Probe members 30 may have an integral electrically conductive body portion 20 such as shown in FIG. 1, or they may comprise separate body sections as hereinafter described with respect to FIG. 2.

Since probe members 30 are electrically conductive, the fixture preferably includes a first electrical insulating hollow open ended sleeve 16 secured in at least preselected openings 14 when platen 4 is made from an electrically conductive material. Sleeves 16 may be omitted in instances where platen 4 is made from an electrical insulating material. Optionally, probe members body portions 20 may be clad with an electrical insulating material to the extent required to prevent electrical contact to a platen 4 made from an electrically conductive material yet enable electrical contact to be made between terminals 10 and contacts 24.

Probe members 30 are axial movable in opposite directions relative openings 14 and sleeve 16 (when employed).

In FIG. 1, platens 2, 4 and 6 are selectively movable by either restricting movement of platen 6 and moving platens 2 and 4 concurrently and/or independently towards and away from platen 6 or by concurrently restricting movement of platens 2 and 4 and moving platen 6 towards and away from platens 2 and 4 or by restricting movement of platen 4 and relative platens 2 and 6 and platens 2 and 6 being concurrently and/or independently movable away from and towards platen 4. Either way, it can readily be seen that contact(s) 24 are caused to move probe members 30 through openings 14 towards terminals 10 to the extent required to provide electrical contact between terminals 10 and contacts 24.

As previously described, platen 6 may comprise a plurality of separate parts illustratively referenced by numerals 6 and 6' which are independently selectively movable towards and away from platens 2 and 4 such that electrical contact between contacts 24 and terminals 10 can be selectively programmed for different sections of the electrical assembly being tested.

Also shown in FIG. 1 is a probe member 30 having a body portion 20' that has a longer axial length than the axial length of body portion 20 of the other probe members 30 shown. Such is to illustrate that the length of the probe members used may not all be the same and that such can be employed where sequential testing is desired so that selected one(s) of the probe members make electrical contact between contacts 24 and the assembly or circuit board terminals before the rest. Such can be effectively employed when the probe members include resilient biasing means such as hereafter described with respect to the test fixture shown in FIG. 2.

Additionally, selected ones of both probe members 30 and contacts 24 may have different lengths to even further increase the sequential testing ability of the test fixture of the invention.

The platens of the test fixture of FIG. 2 are essentially the same as in FIG. 1 excepting that a hole with a conductive metal surface (plating) 32 is included about terminal 10 in the region where it extends through board 12.

Platens 2, 4 and 6 operate in the manner hereinbefore described and for purposes of brevity the selection of electrically conductive and insulative materials is not described since such is well known to those skilled in the art of preventing electrical contact between probe members 30 and platen 4 when platen 4 is made from an electrically conductive material.

In FIG. 2, probe members 30 extend through at least preselected openings of the array of openings 14 through platen 4. In this case however probe members 30 have a singular electrically conductive upper body portion 19 and a separate lower body portion that is divided into separate electrically conductive sections 22 and 34. End 18 of body portion 19 is facing towards and operates to engage terminal 10 of the component 8 scheduled to be tested by test device 28. End 22 of body portion 21 facing towards contact 24 is operable to make electrical contact therewith.

In FIG. 2, a second hollow open ended sleeve 36 is slidably received in first sleeve 16 extending through openings 14 through platen 4. Sleeve 36 is secured to the lower end of body portion 19 by crimping or other suitable means with an end 31 extending therethrough towards second body section 22 which comprises spaced-apart electrically conductive upper section 34 and electrically conductive lower section 21 the latter of which includes opposite end 2 as previously described.

Section 34 is movably disposed within sleeve 36 intermediate body portion 19 and section 21 and sleeve 36 is secured by crimping or other suitable means to section 21. Section 34 may, for example, be a metal ball bearing.

First electrically conductive biasing means, such as a coiled metal spring 40, is disposed within sleeve 36 intermediate section 31 and section 21 and is operative to resiliently urge section 34 against end 31 of body portion 19 to provide an electrical connection between portion 18 and section 21.

Second resilient biasing means such as coiled spring 42 is disposed about sleeve 36. Spring 42 is operative to support probe members 30 within openings 14 and to resiliently urge end 22 of body portion 21 against contact 24 preferably by having an upper end 9 thereof secured to sleeve 16 and having an opposite end 11 thereof secured to sleeve 36 adjacent section 21.

Also shown in FIG. 2 is a contact 24' having a shorter axial length than contact 24. Contact 24' is electrically connectable by means of conductor 26 through intermediate electrical plug 27 to an electrical test device and is operable to make electrical contact with terminal 10' through probe member 30 after contact 24 has made electrical contact through probe member 30 with terminal 10. The combination of having different axial lengths for selected electrical contacts mounted on platen 6 and the division of platen 6 into separate parts hereinbefore described with respect to FIG. 1 provides great versatility in selectively programming the sequence by which various terminals of the electrical assembly are caused to make electrical contact with the test device. Such is of great advantage for sequential programming electrical contact between different terminals of the electrical assembly.

Additionally, selected probe members 30 in registration with terminal 10' and contact 24' may have a shorter axial length such as by having a shorter body portions 19' shown in FIG. 2. Such enables selective sequencing in making electrical contact between terminals of the electrical assembly and the test device under both conditions of movement between platens 2, 4 and 6 hereinbefore described and even further broadens the universality of the fixture of the invention when combined with either or both selectively different axial lengths for the electrical contacts 24, 24' mounted on platen 6 and having the lower platen divided into two or more parts 6, 6' independently movable towards and away from platens 2 and 4 as hereinbefore described.

What is claimed is:

1. A fixture for contacting selected terminals of an electrical assembly, said fixture comprising:
    spaced-apart lower, middle and upper platens selectively movable according to a selected one of: (a) the lower platen being secured against movement relative the upper and middle platens and the upper and middle platens being concurrently and/or independently movable towards and away from the lower platen; and (b) the middle and upper platens being secured against movement relative the lower platen and the lower platen being movable towards and away from the middle and upper platens; and (c) the middle platen being secured against movement relative the upper and lower platens and the upper and lower platens being concurrently and/or independently movable relative the middle platen,
    said upper platen adapted for securement of the assembly thereupon with at least the selected terminals thereof to be contacted respectively extending therefrom towards the middle platen,
    said lower platen having a predetermined array of electrical contacts extending therefrom towards the middle platen respectively corresponding to and in registration with the assembly terminals to be contacted, said electrical contacts restricted against reciprocal movement relative the lower platen and respectively electrically connected to a device operative to provide desired information relative the selected components,
    said middle platen having an array of openings extending transversely therethrough of which selected openings respectively correspond to and are substantially aligned with each of the terminals to be contacted and the respective electrical contacts in registration therewith,
    electrically conductive probe members respectively extending through at least the middle platen selected openings and reciprocally movable therethrough, said probe members respectively having a first end adapted to make electrical contact with the terminal in registration therewith and having an opposite end adapted to electrically engage the electrical contact in registration therewith, and
    said fixture operative such that one of movements (a), (b) and (c) causes the electrical contacts to engage the respective probe members opposite end in registration therewith and thence urge the probe member towards the upper platen for a distance sufficient to enable the first end to make electrical contact with the terminal in registration therewith.

2. The fixture of claim 1 including resilient biasing means mounted on the middle platen and operative to support the respective probe members in the selected openings and to enable the opposite end thereof to resiliently engage the contact.

3. The fixture of claim 1 wherein at least one of said contacts has a different axial length from the rest of said contacts.

4. The fixture of claim 1 or 3 wherein at least one of said probe members has a different axial length from the rest of said probe members.

5. The fixture of claim 1 wherein the lower platen comprises at least two parts that are respectively independently movable towards and away from the middle and upper platens.

* * * * *